Feb. 24, 1953 J. SNYDER 2,629,820

RECIRCULATING DELAY SYSTEM

Filed Aug. 25, 1950 2 SHEETS—SHEET 1

INVENTOR.
JAMES SNYDER
BY Lawrence Glassman
ATTORNEY

Feb. 24, 1953 J. SNYDER 2,629,820

RECIRCULATING DELAY SYSTEM

Filed Aug. 25, 1950 2 SHEETS—SHEET 2

INVENTOR.
JAMES SNYDER
BY Lawrence Glassman
ATTORNEY

Patented Feb. 24, 1953 2,629,820

UNITED STATES PATENT OFFICE 2,629,820

RECIRCULATING DELAY SYSTEM

James Snyder, Belmar, N. J., assignor to the United States of America as represented by the Secretary of the Army Application August 25, 1950, Serial No. 181,540

9 Claims. (Cl. 250—20)

(Granted under Title 35, U. S. Code (1952), sec. 266)

The invention described herein may be manufactured and used by or for the Government for governmental purposes, without the payment of any royalty thereon.

This invention relates to pulse delay systems and more particularly to pulse delay systems in which the pulse is circulated through a relatively short time delay network.

In many target detecting systems, especially in those systems where it is desirable to detect a moving target, it is usually necessary to utilize the effect of a radio frequency pulse at some predetermined time after the occurrence of said pulses. At times, it is desirable to delay these radio frequency pulses with only slight distortion for as long as 1,000 micro-seconds or more. Delay systems employing conventional supersonic, or acoustical, delay lines are limited in their application because of the extensive length required to achieve a delay of 1,000 micro-seconds, or more, inasmuch as the delay in such a line is in the order of 300 micro-seconds per foot. For conventional electrical delay cables, the delay is in the order of only one microsecond per foot.

It is an object of the invention, therefore, to provide a delay system which overcomes the above-mentioned limitation.

It is another object of the invention to provide a delay system in which the time interval between the applied pulse and the utilized output pulse is greater than the time delay of the delay line utilized.

It is still another object to provide a delay system whereby a radio frequency pulse is circulated N times through a short delay line whose length is 1/Nth of the total time delay.

In accordance with my invention the delay system comprises means for circulating radio frequency pulses N times through a delay line having a time delay 1/Nth of the desired total time delay T. The system also comprises means for mixing the applied radio frequency pulse with a heterodyne frequency variable through a predetermined range, means for delaying the difference beat frequency pulse 1/Nth the total time delay T, means for amplifying said beat frequency pulse and feeding said beat pulse back to the delay line, means for mixing the delayed frequency pulses with said predetermined range of frequencies, and means for selecting the desired output frequency pulse after the pulse has been delayed for the total delay time T.

For a better understanding of the invention together with other and further objects thereof, reference is had to the following description taken in connection with the accompanying drawings in which.

Figure 1:
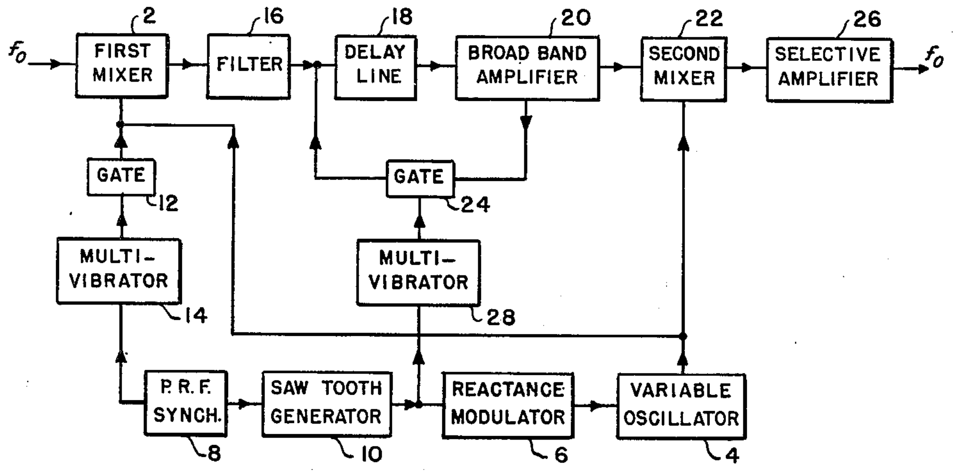
Fig. 1 is a block schematic diagram of a system embodying my invention.

Referring now to Fig. 1, there is shown a delay system which may be associated with a radio locating device operating at a radio frequency corresponding to a wavelength of a few centimeters and having a pulse repetition frequency (PRF) of about 250 cycles per second. The radio frequency pulses applied to the system shown in Fig. 1 may include the initial, or transmitted pulse, and any target echo pulses received during an interval corresponding to one cycle, or the period, of the repetition frequency. It is to be understood, of course, that both the initial transmitted pulse and the received echo pulses are converted to a suitable intermediate radio frequency pulse, hereinafter generally designated as $f_o$, in the conventional manner before being applied to said delay system.

In Fig. 1, the numeral 2 designates a first mixer stage, to which is applied the aforementioned input signal pulse $f_o$ and a signal derivable from variable frequency oscillator 4. Said oscillator is periodically tuned over a desired range by means of reactance modulator 6, to which may be supplied sawtooth control potentials synchronized with PRF source 8 and provided by generator 10. The output frequency of oscillator 4 is thus varied periodically between predetermined lower and upper frequency limits, designated as $f_L$ and $f_U$ respectively, preferably being at a higher frequency than the frequency of input signal pulse $f_o$. If desired the output of oscillator 4 may be varied in discrete steps between said predetermined limits by means well known in the art. First mixer 2 is gated on and off alternately by a suitable switching means such as gate 12 which is periodically activated by voltages derived from a suitable control source such as multivibrator 14. Multivibrator 14, like sawtooth generator 10, is synchronized with PRF source 8 of the associated radio locating set. By this arrangement first mixer 2 is alternately rendered operative and inoperative for intervals corresponding in duration to the period of the pulse repetition frequency, hereinafter designated as T, said period being the total time it is desired to delay input pulse $f_o$ before utilization.

The difference beat frequency signal resulting in the output of first mixer 2 is selected by filter 16 and fed to delay line 18, said delay line having a time delay substantially equal to T/N, hereinafter designated as $t$, where N is an integer and represents the number of times it is desired to circulate input signal pulse $f_o$. Various types of delay networks both electrical and acoustical which are suitable for use in my invention are well known in the art.

Filter 16 is adapted to pass only the range of frequencies between $f_L$—$f_o$ and $f_U$—$f_o$. The signals from delay line 18 are fed to second mixer 22 through broad band amplifier 20, said amplifier comprising several cascaded stages. After passing through several amplifier stages, a portion of the amplified delayed signal is fed back to the input of delay line 18 through a suitable switching means such as gate 24. By this arrangement the signal strength of the pulse fed back to the input of delay line 18 is restored to its initial level. The remainder of said amplified delayed signal is fed through the remaining stages of amplifier 20 and applied to second mixer 22 where it is heterodyned with the periodically varying frequency from oscillator 4, which is also fed to second mixer 22. The signals resulting in the output of said second mixer, which includes the difference between the signals fed therein, are fed into selective amplifier 26 which is tuned to accept only input frequency pulse $f_o$. It is to be understood that the bandwidth requirements of filters 16, delay line 18 and broad band amplifier 20 may be a function of N, as well as the frequency spectrum of the applied pulse $f_o$.

Gate 24 is periodically opened by voltages derived from a suitable control source such as multivibrator 28 having asymmetrical rectangular output pulses. The output of multivibrator 28 is so arranged that the feed back from amplifier 20 to the input of delay line 18 is periodically blocked for a period corresponding in duration to the interval $t$. The end of the blocking pulse coincides with the start of alternate cycles of the output from sawtooth generator 10.

In operation, the input signal $f_o$ to mixer 2 is heterodyned with $f_v$ from oscillator 4 to produce a beat frequency signal $f_v$—$f_o$. This beat frequency signal is circulated several times through delay line 18, and after the Nth time, signal $f_v$—$f_o$ is heterodyned with $f_v$ in second mixer 22. The resulting signal is $f_o$, which passes through selective amplifier 26 and is therefore utilized after a total delay time T.

Figure 2:
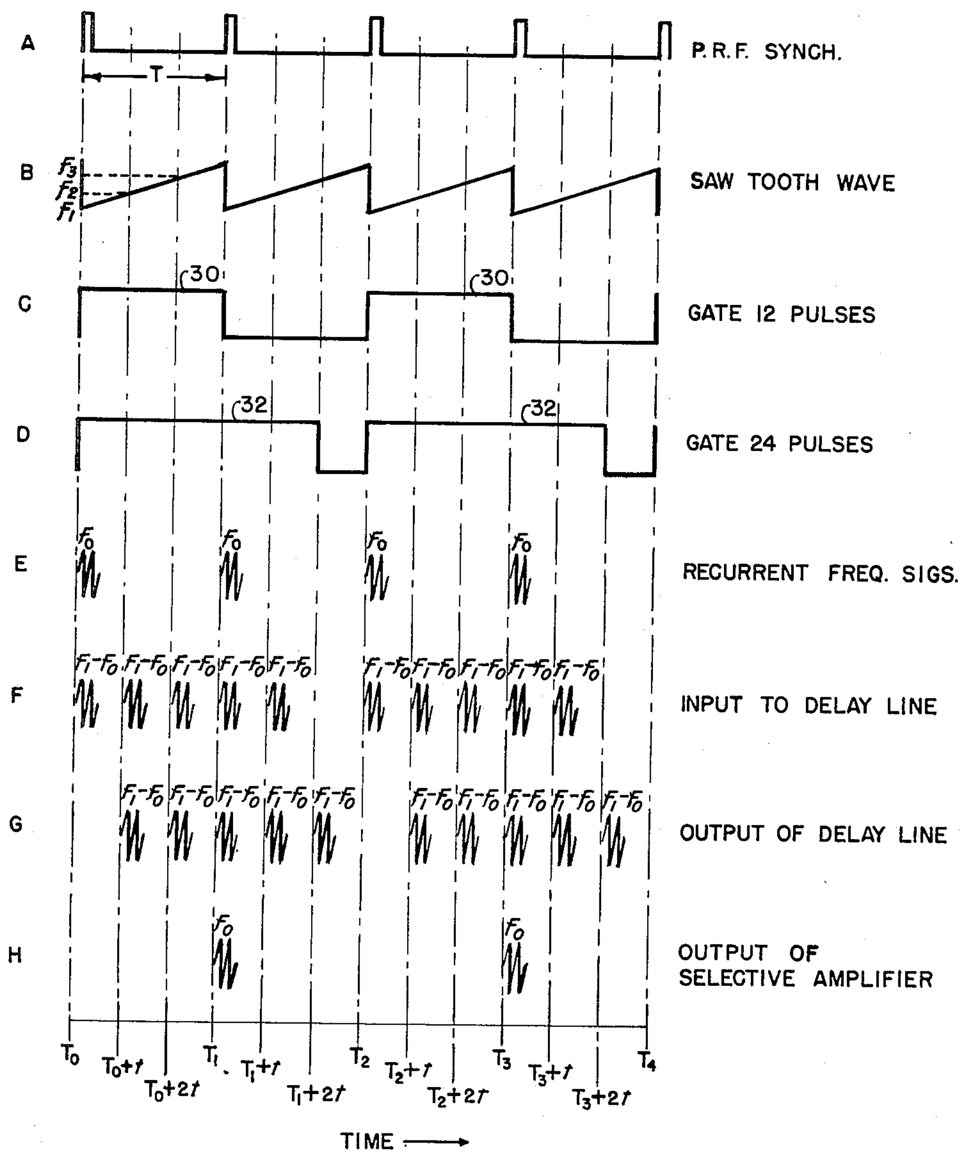
Fig. 2 is a set of curves used in explaining the operation of my invention.

The operation of the invention may be seen more clearly by referring to Fig. 2. In Fig. 2, curves A, B, C and D represent substantially the relative timing of the PRF synchronizing source 8, the cyclic output of variable oscillator 4, and the timing of the rectangular wave output pulses derived from multivibrators 14 and 28 which are applied to gates 12 and 24 respectively. Curves E, F, G and H illustrate the corresponding radio frequency pulses periodically appearing at the input to first mixer 2, the input to delay line 18, the output of delay line 18 and the output of selective amplifier 26, respectively. To better understand the operation of the invention, it is to be assumed that input signal $f_o$ is to be circulated three times before being utilized. Accordingly, delay line 18 is so selected that any signal passing therethrough will be delayed for the interval $t$ corresponding to T/3.

A typical cycle of operation is now described, reference being had to the curves of Fig. 2. At time $T_o$, multivibrators 14 and 28 start rectangular pulses 30 and 32 to open up switch gates 12 and 24, respectively. Thus at $T_o$, first mixer 2 is rendered operative and gate 24 permits signals to be fed back from broadband amplifier 20 to the input of delay line 18. The output from oscillator 4 at time $T_o$ is assumed to be $f_1$. As stated hereinbefore, the useful output of first mixer 2 is the difference between the signals fed therein, namely $f_1$—$f_o$. This difference beat frequency pulse signal is applied to the input of delay line 18 through filter 16. At time $T_o$, the heterodyning frequency applied to second mixer 22 from oscillator 4 is also $f_1$. Inasmuch as selective amplifier 26 is tuned to accept only signals having frequency $f_o$, it can readily be seen that at time $T_o$ no output from selective amplifier 26 may be utilized because of the delay inherent in delay line 18. At time $T_o+t$ signal $f_1$—$f_o$ is applied to second mixer 22 through broad band amplifier 20. In said second mixer, $f_1$—$f_o$ is heterodyned with frequency $f_2$, the output from oscillator 4 at time $T_o+t$. The signals resulting in the output of second mixer 22 include the difference between the signals fed therein, namely ($f_1$—$f_o$)—$f_2$ in which ($f_1$—$f_o$) must be considered a scalar quantity. It can readily be seen that at time $T_o+t$ this resulting frequency cannot pass through selective amplifier 26 which is tuned to $f_o$. As explained above, broad band amplifier 20 consists of several cascaded stages, and after passing through several stages, a portion of the amplified delayed signal ($f_1$—$f_o$) is fed back to the input of delay line 18 through gate 24, which is unblocked by positive rectangular pulse 32 from multivibrator 28. At time $T_o+t$ therefore, the input to delay line 18 is ($f_1$—$f_o$). For purposes of explanation, it is to be assumed at this point that there are no other input frequency signals $f_o$ applied to first mixer 2 to heterodyne with the frequency output from oscillator 4. This being the case, at time $T_o+t$, the only signal applied to delay line 18 is $f_1$—$f_o$, since oscillator output frequency $f_2$ cannot pass through filter 16.

At time $T_o+2t$, the input signal to second mixer 22 is $f_1$—$f_o$ and this signal is heterodyned with a frequency $f_3$, the output from variable oscillator 4 at said time. The signals now resulting in the output of second mixer 22 include ($f_1$—$f_o$)—$f_3$. Obviously, this resulting frequency cannot pass through selective amplifier 26. A portion of ($f_1$—$f_o$) is again fed back to the input of delay line 18 through gate 24 and the cycle is repeated. Thus at time $T_1$ the input to second mixer 22 from delay line 18 is again ($f_1$—$f_o$). Since the duration $T_o$ to $T_1$ corresponds to the desired interval T, the output of oscillator 4 at time $T_1$ is $f_1$. Therefore, at time $T_1$, signal frequency pulse $f_1$—$f_o$ is heterodyned with frequency $f_1$ in second mixer 22. The signal resulting in the output of second mixer 22 at time $T_1$ includes ($f_1$—$f_o$)—$f_1$, in which ($f_1$—$f_o$) must be considered a scalar quantity. It is apparent that this resulting frequency is $f_o$, the signal frequency which is accepted by selective amplifier 26 and utilized after a delay of time interval T.

At time $T_1$, pulse 30 ends thereby closing gate 12, so that for the time interval T corresponding with the duration $T_1$ to $T_2$, no signals are applied to delay line 18. However, at time $T_1$, signal ($f_1$—$f_o$) is still being recirculated through delay line 18. At time $T_1+t$ the input to second mixer 22 is ($f_1$—$f_o$) from delay line 18, and $f_2$ from oscillator 4. As previously shown, with these frequencies applied to second mixer 22, no output from selective amplifier 26 is available. Similarly, at time $T_1+2t$ the input to second mixer 22 is ($f_1$—$f_o$) from delay line 18 and $f_3$ from oscillator 4 and there is no output from selective amplifier 26. At time $T+2t$, however, pulse 32 ends thereby closing gate 24 so that for the duration $T+2t$ to $T_2$, no signals are fed back to delay line 18. By this arrangement, said delay line is cleared of all signals to permit another cycle of operation. At time $T_2$, rectangular pulses 30 and 32 are again started and the above-described cycle is repeated.

While I have described the operation of the system for an input signal applied at the beginning of each heterodyne sweep frequency, it will be apparent that the system will operate in the same manner for pulses applied at a later time to mixer 2 provided said mixer is rendered operative by rectangular pulse 30. Furthermore other switching arrangements other than those shown may be employed to produce substantially the same mode of operation as will be apparent to those versed in the art. For example, instead of using multivibrators, other rectangular generators may be used, and instead of gates 12 and 24, fast acting relays may be substituted.

Figure 3:
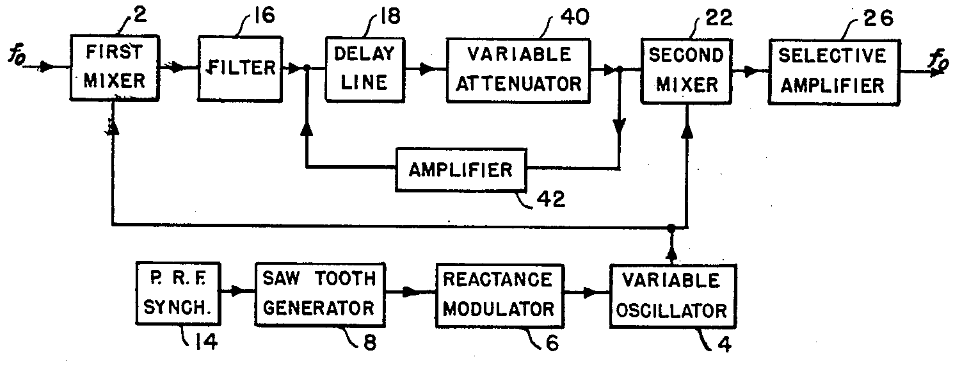
Fig. 3 is a block schematic diagram of a preferred embodiment of my invention.

Fig. 3 illustrates a modification of my invention in which the gating circuits are eliminated. Elements which are similar to those of the circuit of Fig. 1 have been given identical reference numerals. As shown, a portion of the delayed first beat signal ($f_1$—$f_0$) is fed back to the input of delay line 18 through variable attenuator 40 and amplifier 42. Amplifier 42 merely functions as a unidirectional device and any other suitable device may be used. The attenuation of the signal fed back to the input of delay line 18 is adjusted so that after time interval T, when the desired number of circulations have been completed, any further circulation of delayed signal ($f_1$—$f_0$) will have been attenuated to a negligible value. To illustrate the operation of the system, let it be assumed that to achieve a delay of time T, it is necessary to circulate ($f_1$—$f_0$) through delay line 18 at least four times. Furthermore, it is to be assumed that the signal entering delay 18 for the first time has a signal strength of 128 volts and that variable attenuator 40 is adjusted to achieve an attenuation of 4, which includes the attenuation through delay line 18. Thus, after the fourth time through delay line 18, beat frequency signal ($f_1$—$f_0$) is utilized in selective amplifier 26 to produce $f_0$ as explained above. The relative signal strength of said signal at the input to mixer 22 at this time is 0.5 volt. However, after the eighth circulation the signal strength has been reduced to approximately .008 volt which, when compared to the desired 0.5 volt signal, is negligible for all practical purposes. Thus, after time interval T only the applied input signal $f_0$ to first mixer 2 will be effectively utilized at selective amplifier 26.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An apparatus for delaying radio frequency signals a predetermined time interval, comprising in combination a source of periodically recurring synchronizing pulses having a period substantially equal to said predetermined time interval, means responsive to said synchronizing pulses for periodically producing a varying heterodyne frequency, a first mixer responsive to said heterodyne frequency and said radio frequency signals whereby said radio frequency signals are combined with said heterodyning frequency to produce a first beat frequency signal, delay means coupled to the output of said first mixer for delaying said first beat frequency signal by an amount substantially equal to 1/N of said time interval, N being an integer, an amplifier for the delayed first beat frequency signal, means for circulating the delayed first beat frequency signal at least N times through said delay means and said amplifier, a second mixer responsive to said heterodyne frequency and the output of said amplifier for combining each of said circulating signals with said heterodyning frequency to produce a second beat frequency signal, and means coupled to the output of said second mixer for utilizing only those second beat frequency signals having a frequency equal to the frequency of said radio frequency signals.

2. An apparatus for delaying recurrent radio frequency signals a predetermined time interval, comprising in combination a source of periodically recurring synchronizing pulses having a period substantially equal to said predetermined interval, means responsive to said synchronizing pulses for producing a varying heterodyne frequency, a first mixer responsive to said heterodyne frequency and said recurrent radio frequency signals whereby said recurrent radio freqency signals are combined with said heterodyning frequency to produce a first beat frequency signal, an acoustical delay line coupled to the output of said first mixer for delaying said first beat frequency signal by an amount substantially equal to 1/N of said time interval, N being an integer, an amplifier for the delayed first beat frequency signal, means for circulating the delayed first beat frequency signal at least N times through said delay line and said amplifier, a second mixer responsive to said heterodyne frequency and the output of said amplifier for combining a portion of each of said circulating signals with said heterodyning frequency to produce a second recurring beat frequency signal, and means coupled to the output of said second mixer responsive only to those second beat frequency signals having a frequency equal to the frequency of said recurrent radio frequency signals.

3. An apparatus for delaying radio frequency signals a predetermined time interval comprising in combination a source of periodically recurring synchronizing pulses having a period substantially equal to said predetermined interval, an oscillator for generating a heterodyning frequency, means for periodically varying said heterodyning frequency through a predetermined range at a rate substantially equal to the recurrence rate of said synchronizing pulses, a first mixer coupled to the output of said oscillator and responsive to said radio frequency signals whereby said radio frequency signals are combined with said heterodyning frequency to produce a first beat frequency signal, gating means responsive to said synchronizing pulses for rendering said first mixer alternately operative and inoperative for a duration substantially equal to said time interval, an acoustical delay line coupled to the output of said first mixer for delaying said first beat frequency signal by an amount substantially equal to 1/N of said time interval, N being an integer, an amplifier for the delayed first beat frequency signal, means for circulating a portion of each of the amplified delay signals through said delay line at least N times, a second mixer coupled to the output of said amplifier and responsive to said heterodyning frequency for combining the remainder of each of said circulating signals with said heterodyned frequency to produce a second beat frequency signal and a selective amplifier responsive only to those second beat frequency signals having a frequency equal to the frequency of said radio frequency signals.

4. An apparatus for delaying radio frequency signals a predetermined time interval comprising a first mixer to which said signals are applied, a second mixer, an oscillator for generating a heterodyning frequency and having its output coupled simultaneously to said first and second mixers, means for periodically varying said heterodyning frequency through a predetermined range whereby said heterodyning frequency is combined with the radio frequency signals applied to said first mixer to produce a first beat frequency signal, a delay line interconnecting said first and second mixer whereby said beat frequency signal is delayed by an amount equal to 1/N of said time interval, before being applied to said second mixer, N being an integer, said heterodyne frequency combining with the delayed first beat frequency signal in said second mixer to produce a second beat frequency signal, means for circulating the delayed first beat frequency signal through said delay line in the same direction at least N times, and means coupled to the output of said second mixer for utilizing only those second beat frequency signals having a frequency equal to the frequency of said radio frequency signals.

5. An apparatus for delaying radio frequency signals a predetermined time interval comprising in combination an oscillator for generating heterodyning frequencies, means for periodically varying said heterodyning frequencies through a predetermined range, a first mixer responsive to said radio frequency signals and said heterodyning frequencies for periodically converting said radio frequency signals to a first beat frequency signal by combining said radio frequency signals with said heterodyning frequencies, means for delaying said first beat frequency signal by an amount substantially equal to 1/N of said time interval, N being an integer, means for circulating said delayed beat frequency through said delay means in the same direction for at least N times, a second mixer responsive to said heterodyning frequencies and the output of said delay means for converting each of said circulated signals to a second beat frequency signal by combining each of said circulated signals with said heterodyning frequencies, and means for utilizing only those second beat frequency signals having a frequency equal to said radio frequency signals.

6. An apparatus for delaying radio frequency signals a predetermined time interval comprising in combination a source of periodically recurring synchronizing pulses having a period substantially equal to said predetermined interval, an oscillator for generating a heterodyning frequency, means for periodically varying said heterodyning frequency through a predetermined range at a rate substantially equal to the recurrence rate of said synchronizing pulses, a first mixer coupled to the output of said oscillator and responsive to said radio frequency signals for periodically converting said radio frequency signals to a first beat frequency signal by combining said radio frequency signals with said heterodyning frequency, gating means responsive to said synchronizing pulses for rendering said first mixer alternatively operative and inoperative for a duration substantially equal to said time interval, means for delaying said first beat frequency signal by an amount substantially equal to 1/N of said time interval, N being an integer, means for circulating said delayed beat frequency signal through said delay means in the same direction for at least N times, a second mixer responsive to said heterodyning frequency and the output of said delay means for converting each of said circulated signals to a second beat frequency signal by combining each of said circulated signals with said heterodyning frequency, a selective amplifier responsive only to those second beat frequency signals having a frequency equal to said radio frequency signals.

7. An apparatus for delaying radio frequency signals a predetermined time interval comprising in combination an oscillator for generating heterodyning frequencies, means for periodically varying said heterodyning frequencies through a predetermined range, a first mixer coupled to the output of said oscillator and responsive to said radio frequency signals for periodically converting said radio frequency signals to a first beat frequency signal by combining said radio frequency signals with said heterodyning frequencies, means for delaying said first beat frequency signal by an amount substantially equal to 1/N of said time interval, N being an integer, means for continuously circulating said delayed beat frequency through said delay means in the same direction, a second mixer responsive to said heterodyning frequencies and the output of said delay means for converting each of said circulated signals to a second beat frequency signal by combining each of said circulated signals with said heterodyning frequencies, and means for utilizing only those second beat frequency signals having a frequency equal to said radio frequency signals.

8. An apparatus for delaying recurrent radio frequency signals a predetermined time interval, comprising in combination a source of periodically recurring synchronizing pulses having a period substantially equal to said predetermined interval, means responsive to said synchronizing pulses to produce a heterodyning frequency varying in discrete steps between predetermined limits, a first mixer responsive to said radio frequency signals and said heterodyning frequency for converting said recurrent radio frequency signals to recurring first beat frequency signals by combining said radio frequency signals with said heterodyning frequency, an acoustical delay line coupled to the output of said first mixer for delaying said first beat frequency signal by an amount substantially equal to 1/N of said time interval, N being an integer, means for circulating the delayed first beat frequency signal at least N times through said delay line, a second mixer responsive to said heterodyning frequency and the output of said delay line for converting each of said circulated signals to a second beat frequency by combining a portion of each of said circulating signals with said heterodyning frequency, and means coupled to the output of said second mixer responsive only those second beat frequency signals having a frequency equal to the frequency of said recurrent radio frequency signals.

9. An apparatus for delaying recurrent radio frequency signals a predetermined time interval, comprising in combination a source of periodically recurring synchronizing pulses having a period substantially equal to said predetermined interval, means responsive to said synchronizing pulses to produce a linearly varying heterodyning frequency, a first mixer responsive to said heterodyning frequency and the output of said delay line for converting said recurrent radio frequency signals to recurring first beat frequency signals by combining said recurrent radio frequency signals with said heterodyning frequency, an acoustical delay line coupled to the output of said first mixer for delaying said first beat frequency signal by an amount substantially equal to 1/N of said time interval, N being an integer, means for circulating the delayed first beat frequency signal at least N times through said delay line, a second mixer for converting each of said circulated signals to a second beat frequency by combining a portion of each of said circulating signals with said heterodyning frequency, and means coupled to the output of said second mixer responsive only those second beat frequency signals having a frequency equal to the frequency of said recurrent radio frequency signals.

JAMES SNYDER.

REFERENCES CITED

The following references are of record in the file of this patent:

UNITED STATES PATENTS

| Number | Name | Date |
|---|---|---|
| 2,406,316 | Blumlein et al. | Aug. 27, 1946 |
| 2,422,135 | Sanders | June 10, 1947 |
| 2,487,995 | Tucker | Nov. 15, 1949 |